United States Patent [19]

Stansbury et al.

[11] Patent Number: 5,180,093
[45] Date of Patent: Jan. 19, 1993

[54] APPARATUS FOR ULTRASONIC BONDING

[75] Inventors: Randall R. Stansbury, Jim Falls; Michael R. Seitz, Chippewa Falls, both of Wis.

[73] Assignee: Cray Research, Inc., Eagan, Mich.

[21] Appl. No.: 755,067

[22] Filed: Sep. 5, 1991

[51] Int. Cl.$^5$ .............................................. B23K 20/10
[52] U.S. Cl. ........................................ 228/1.1; 228/55
[58] Field of Search ........................ 228/1.1, 4.5, 55; 279/83; 82/148, 158, 161; 408/233, 713, 231, 186, 181, 199; 156/580.1

[56] References Cited

U.S. PATENT DOCUMENTS

| | | | |
|---|---|---|---|
| 209,252 | 10/1878 | Gill | 279/83 |
| 228,811 | 6/1880 | Goodell | 279/83 |
| 483,865 | 10/1892 | Potter et al. | 279/83 |
| 776,250 | 11/1904 | Mathieu et al. | 279/83 |
| 2,073,430 | 3/1937 | Tautz | 279/83 |
| 2,452,211 | 10/1948 | Rosenthal | 228/1.1 |
| 3,610,506 | 10/1971 | Robinson | 228/1.1 |
| 3,747,198 | 7/1973 | Benson et al. | 228/1.1 |
| 3,954,217 | 5/1976 | Smith | 228/110 |
| 4,591,087 | 5/1986 | Frasch | 228/110 |

OTHER PUBLICATIONS

Small Precision Tools, a brochure entitled *Thermosonic Capillaries for Fine Pitch Bonding*, 1 p. labelled Exhibit A.
Small Precision Tools, a brochure entitled *Tip Style TS70 Thermosonic (T/S) Tailless Capillary Bonding Tips*, 1 p. labelled Exhibit B.
Small Precision Tools, a brochure entitled *Ultrasonic Gold Wire Bonding Tools*, 1 p. labelled Exhibit C.
Small Precision Tools, a brochure entitled *AutoBonding Tool* ®, 1 p. labelled Exhibit D.

*Primary Examiner*—Samuel M. Heinrich
*Attorney, Agent, or Firm*—Merchant, Gould, Smith, Edell, Welter & Schmidt

[57] ABSTRACT

An ultrasonic transducer, bonding tool and method of bonding gold or gold plated leads to gold or gold plated bonding pads located on unheated substrates is disclosed. More particularly, the transducer of the present invention incorporates a modified transducer/tool interface which provides for increased durability as well as increased excursion control of any bonding tool placed therein. The bonding tool of the present invention includes a modified end having a raised pattern used to form an impression in the lead to be bonded to enhance gripping of the lead during bonding. The preferred methods include using the modified transducer and bonding tool to perform gold-to-gold bonding on unheated substrates while providing increased vertical clearance for bonding between structures.

5 Claims, 3 Drawing Sheets

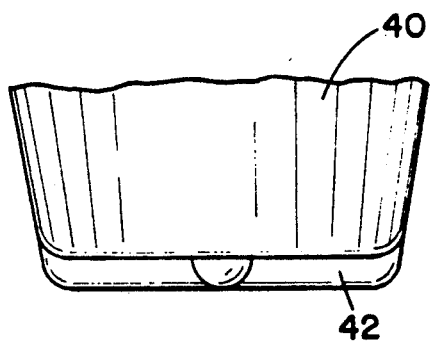
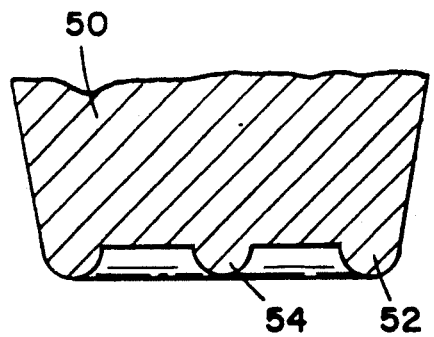
FIG. 5  FIG. 7
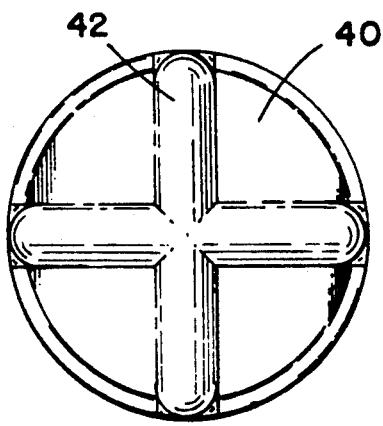
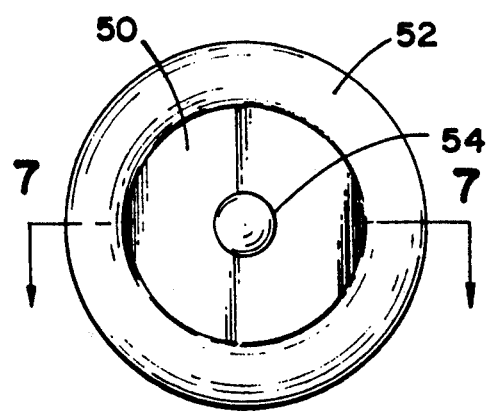
FIG. 4  FIG. 6
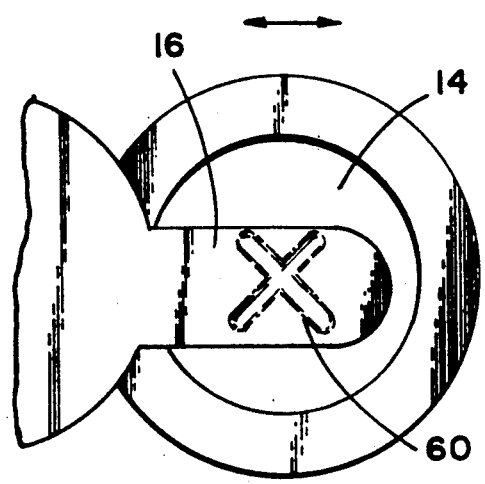
FIG. 8

APPARATUS FOR ULTRASONIC BONDING

FIELD OF THE INVENTION

This invention relates generally to gold-to-gold bonding of leads to bonding pads. More particularly, the present invention discloses a durable transducer tip design, bonding tool tip design and methods of bonding gold or gold plated leads to gold plated bonding pads with or without thermal augmentation of the bonding tool, as well as a method of deep access bonding of leads to bonding pads or other surfaces.

BACKGROUND OF THE INVENTION

A gold-to-gold interconnection system eliminates the intermetallic problems commonly associated with the use of two different metals which are ultrasonically bonded, such as differential diffusion creating Kirkendall voids or "purple plague", which pose reliability problems when two types of metals are ultrasonically bonded. Gold wire bonding and tape automated bonding (TAB) are fairly common and reliable methods of interconnection on integrated circuits and between integrated circuits, but usually require heating of the integrated circuit or substrate, commonly at temperatures of 200-250° C. Various methods of making electrical connections using TAB tape lead frames to connect integrated electrical components, tin/lead-to-tin/lead solder reflow methods (both single point and gang thermode), or tin-to-gold eutectic thermal compression methods (single point and gang thermode) are all methods well known to those skilled in the art.

Gold-to-gold ultrasonic diffusion bonding of electrical interconnects between TAB tape lead frames and printed circuit board substrates is, however, a difficult interconnect process to achieve because it requires tighter control of the bonding variables and other factors influencing the strength of bonds. As a result, such bonds are not suited for a reliable high volume production connection process using known bonding methods.

Gold-to-gold thermal compression bonding has typically been used for TAB bonding of lead frames to substrates by either single point or gang bonding modes of operation, but it is severely limited by the slow cycle times and extremely high temperatures (up to 500° C.) required to produce reliable bonds. As a result, thermal compression bonding is not desirable, or even possible, in high volume production electrical interconnect applications of integrated circuits with gold plated TAB lead frames connected to gold plated printed circuit board substrates of epoxy resin material construction which require high through-put and low temperature levels to avoid damaging the connected components.

Gold-to-gold ultrasonic diffusion bonding of electrical connections between TAB tape lead frames and printed circuit boards is difficult to achieve without damaging components located on the boards when deep access bonding is required. Problems include bonding tools, typically available only in industry standard lengths of 0.375 and 0.437 inches when being utilized for TAB bonding applications, which do not provide enough vertical clearance between the components and the ultrasonic transducer. Increasing the length of a standard bonding tool and using a standard transducer reduces excursion control of the bonding tool tip, resulting in random, nonrepeatable motion of the tip which negatively impacts bond strength and repeatability. In addition, another serious problem is transducer wear at the bonding tool/transducer tip interface which is attributable to the longer tool length needed to perform deep access bonding. The standard transducer design includes a circular bore to hold the bonding tool which rapidly wears into an elliptically-shaped hole when the required ultrasonic power is supplied of the transducer. That distortion to the transducer only adds to the loss of excursion control. Deep access gold-to-gold ultrasonic diffusion bonding, however, requires an even tighter level of control of the ultrasonic bonding variables and factors influencing the bondability—control the current art does not provide.

An even more difficult process is deep access bonding to bonding pads located on epoxy resin substrates which cannot be heated without damaging the components on or in the board. As a result, no reliable gold-to-gold TAB interconnect process involving non-bumped gold pads on epoxy resin substrates or PTFE construction printed circuit board substrates (which cannot tolerate elevated temperatures) is known in the art. In addition, deep access bonding between integrated circuit bodies located on such printed circuit boards has also been unknown in standard practice.

Other problems encountered in gold-to-gold ultrasonic bonding with an unheated, i.e., room temperature, substrate is control of the high power required to perform such ultrasonic bonding applications. The high power, like the increased bonding tool length required for deep access bonding, also reduces excursion control of the bonding tool tip, resulting in random, non-repeatable motion of the tip which negatively impacts bond strength and repeatability. The higher power also dramatically increases transducer wear at the bonding tool/transducer tip interface beyond that seen when only a longer bonding tool is used. The resulting gold-to-gold deep access bonding on an unheated substrate cannot be accomplished at rates and reliability levels required for high volume production.

SUMMARY OF THE INVENTION

To overcome the limitations and problems described above, the present invention provides an improved transducer and method of use adapted to hold an ultrasonic bonding tool for bonding gold-plated leads to gold bonding pads on printed circuit boards. The preferred transducer offers greater excursion control over the tip of the bonding tool than that offered in standard transducers because of its modified V-groove design. In addition, the preferred transducer design provides a more durable transducer/tool interface which is not subject to wear at the rate of a standard transducer/tool interface when bonding at high power.

The preferred embodiment of the present invention also provides an improved bonding tool and preferred method of use which grips the lead to be bonded and "wipes" it across a bonding pad in a substantially linear manner. The additional control allows the bonding tool to be used with the high power required in cold gold-to-gold ultrasonic bonding, whether or not thermal augmentation of the bonding tool is provided.

The additional control provided by both the preferred transducer design with its V-groove and the preferred bonding tool design also allows deep access bonding, a process which, like cold gold-to-gold bonding, requires higher power levels than those associated with ultrasonic bonding using standard length bonding tools.

The benefits and advantages in both bond strength and repeatability of the modified V-groove transducer and bonding tool tip have been statistically verified through destructive pull testing and accelerated aging. In destructive pull testing, the average force required to part bonds produced using the modified transducer and bonding tool of the present invention was 43% higher than the average force required to part bonds produced using standard transducers and bonding tools. In addition, the standard deviation of the pull testing values for the modified transducer and bonding tool of the present invention was 9.97%, while the standard deviation for the standard transducers and bonding tools was 37.13%. The additional reliability and uniformity provided by the present invention allows high volume production of gold-gold ultrasonic bonding.

In the preferred embodiment, the transducer comprises a bonding tool passage that has at least two substantially flat surfaces which intersect each other opposite the end of the ultrasonic transducer to form the V-shaped portion of the bonding tool passage. The bonding tool passage of the preferred embodiment is intersected by a retaining passage formed through the end of the transducer, preferably aligned with the transducer's longitudinal axis. The retaining passage is threaded to receive a retaining screw used to retain the bonding tool within the bonding tool passage. In use the retaining screw is tightened upon the side of the bonding tool to force it into contact with the flat surfaces of the V-groove.

In the preferred embodiment, the intersection of the flat surfaces of the bonding tool passage is substantially perpendicular. In addition, the retaining passage preferably extends through the flat surfaces of the bonding tool passage in order to provide a four-point contact area between the flat surfaces of the transducer and bonding tool. That four point contact area provides the additional excursion control to the bonding tool tip as well as increasing the life of the transducer/tool interface when high power is applied to the tool.

The preferred bonding tool of the present invention includes gripping means on its working end for gripping a lead during bonding. The preferred gripping means is a raised pattern formed on the working end of the tool adapted to form a corresponding impression in the lead. In the preferred embodiment, the raised pattern and corresponding impression cooperate to hold the lead under the working end of the bonding tool during ultrasonic bonding of the lead to a bonding pad, even under the high power levels associated with some of the methods of bonding.

In the preferred embodiment, the gripping means raised pattern provides resistance to movement of the lead under the bonding tool in more than one direction. The preferred pattern is a substantially X-shaped pattern with alternate embodiments including a circular pattern, waffle-shaped pattern or any other pattern which provides resistance to movement of the lead in more than one direction. In the preferred embodiment, the raised gripping means pattern is formed of a diamond composite material to provide extended wearability of the bonding tool. Also, in the preferred embodiment used for deep access bonding, the tool is 0.750 inches long, providing the ability to bond between components located on the surface of the printed circuit board without contacting and/or damaging the components.

The preferred method of ultrasonically bonding a gold plated lead to a gold plated bonding pad on a printed circuit board comprises the steps of placing the lead above the bonding pad, bringing the bonding tool in contact with the lead to force it into contact with the bonding pad and form a multi-directional impression in the lead using the raised pattern on the end of the preferred bonding tool. The impression and raised pattern cooperate to hold the lead under the tool which is then ultrasonically vibrated to bond the lead to the bonding pad. In the preferred method, the raised pattern on the bonding tool forms a substantially X-shaped pattern in the lead. In alternate preferred methods, the raised pattern on the bonding tool forms a substantially waffle-shaped pattern or a substantially circular pattern in the lead.

In the preferred method, the bonding tool and associated raised pattern are heated to aid in forming the impression in the lead, while the board substrate is not heated by any external source other than the heat supplied by the bonding tool during bonding. The heat is preferably supplied to the bonding tool by an external resistance heater, but can also be supplied by a heated gas jet, laser or any other suitable means.

In the preferred method, the bonding tool moves the lead in a substantially linear manner across the bonding pad, with the preferred X-shaped pattern on the tool corresponding and impression in the lead rotated at a 45° angle to the direction of linear vibration. This control over the bonding tool excursion is available primarily because of the additional control afforded by the V-groove design of the transducer tip of the present invention.

Also in the preferred method, the printed circuit board substrate consists of a dual-density epoxy resin, with the resin located directly beneath the bonding pads being a more rigid and a softer, less rigid epoxy resin located below the first layer of epoxy resin to absorb and disperse the ultrasonic energy applied to the bonding pad. This dual-density construction is important to supply a firm base for the high power levels used in bonding while protecting any components which are embedded in the board itself.

An alternate method includes using the impressions formed on the leads bonded to the bonding pads as registration marks to automatically control placement of the bonding tool on successive leads in a more accurate manner.

BRIEF DESCRIPTION OF THE DRAWINGS

Having briefly discussed the invention, it will be better understood from the detailed discussion of the invention that follows taken in conjunction with the attached drawings, wherein:

FIG. 4 -end view of the bonding tool of the preferred embodimen . the raised pattern;

FIG. 5 enlarged partial side view of the end of the preferred tool;

FIG. 6 is an enlarged end view of an alternate embodiment of the bonding tool;

FIG. 7 enlarged partial side view of the end of the bonding tool as shown in FIG. 6;

FIG. 8 is an enlarged top view showing a lead bonded to a substrate by the preferred embodiment of the bonding tool.

DETAILED DESCRIPTION OF THE PREFERRED EMBODIMENTS

In the following detailed description of the preferred embodiments and methods, reference is made to the accompanying drawings which form a part hereof, and in which is shown, by way of illustration, specific embodiments in which the invention may be practiced. It is to be understood that other embodiments and methods may be utilized and structural changes may be made without departing from the scope of the present invention as defined by the claims.

Figure 1:
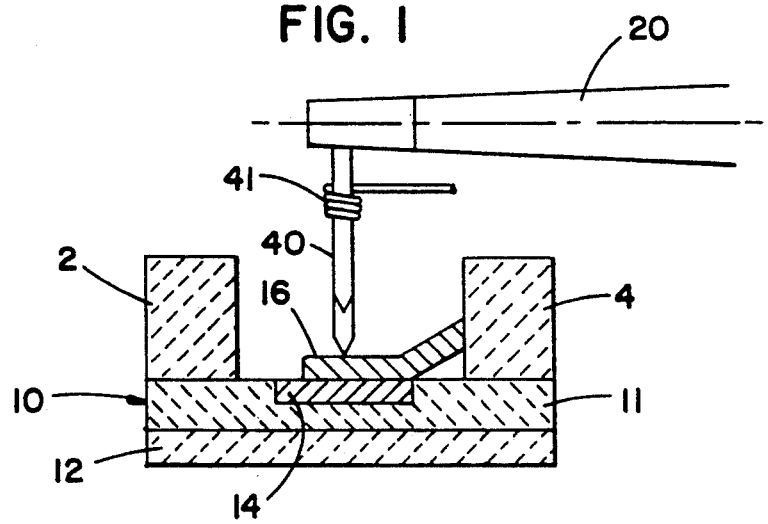
FIG. 1 is a side view of the bonding process.

A view of the preferred bonding method is depicted in FIG. 1. The preferred method essentially comprises the "cold" gold-to-gold bonding of gold plated leads 16 to gold plated bonding pads 14. The reference to "cold" bonding is directed at the lack of any thermal augmentation of the substrate 10, which is typically done under standard gold-to-gold ultrasonic bonding methods. Any further references to cold bonding should be understood as referring to gold-to-gold bonding of gold plated leads 16 to gold plated bonding pads 14 located on an unheated substrate 10.

Also within the scope of the present invention is the addition of deep access bonding to the already described cold gold-to-gold bonding. "Deep access" bonding is depicted in FIG. 1, which shows an ultrasonic transducer 20 which holds an elongated bonding tool 40 to ultrasonically bond a gold plated lead 16 to a gold plated bonding pad 14 between structures 2, 4 which are located on the substrate 10.

Both cold and deep access bonding require the use of higher power levels in the ultrasonic bonding process than those typically used in bonding gold plated leads on heated substrates. More details on the transducer 40 requirements are contained in the detailed descriptions of the preferred methods.

Preferred Bondinq Tool

In the preferred embodiment used for deep access bonding of gold plated leads 16 to gold plated bonding pads 14, the bonding tool 40 has a length of 0.750 inches, as opposed to 0.375 inches and 0.437 inches, which are more standard lengths for bonding tools. It will be understood, however, that if only cold bonding as described above is being performed, the bonding tool 40 can have any suitable length.

As shown in FIGS. 4 and 5, the preferred bonding tool 40 includes a raised pattern 42 applied to the bonding end of an ultrasonic bonding tool 40. The raised pattern 42 must be able to grip the lead 16 and prevent it from moving out from under the bonding tool 40. To do that, the raised pattern 42 must restrain the lead in more than one direction, i.e., a pattern consisting of a straight line would not be sufficient to restrain the lead 16 because it would operate primarily only in the direction perpendicular to the line.

FIG. 4 depicts the preferred raised pattern 42, which is in the shape of an X. In the preferred embodiment, the raised pattern 42 is preferably formed of a diamond composite to provide extended wear of the bonding tool tip. Those skilled in the art will recognize that many other compounds and/or materials can be substituted for the diamond composite of the preferred embodiment forming the raised pattern 42 including, but not limited to, titanium carbide, tungsten carbide, cubic boron nitride, osmium or ceramic. The diamond composite of the preferred embodiment is supplied by the tool manufacturer, Small Precision Tools, Petaluma, California.

The raised pattern 42 must also provide a sufficient amount of surface area to adequately dissipate the ultrasonic energy flowing from the transducer 20 to the bonding tool 40 and to the lead 16 to be bonded. Patterns having an insufficient amount of surface area can cut the lead 16 or drill through it, and fail to bond it to the bonding pad 14.

An alternate embodiment of the raised pattern is shown in FIGS. 6 and 7. The alternate pattern consists of a circle 52 and a raised dot 54 located in the center of that circle. The composition of this alternate pattern is also preferably of a diamond composite for extended wearability, but can be made of alternate materials as described above.

A bonded lead 16 and bonding pad 14 are depicted in a top view in FIG. 8. The preferred embodiment of the bonding tool 40 was used to bond the lead 16 and bonding pad 14 which resulted in the X-shaped impression 44 formed in the lead 16.

In the preferred embodiment, the bonding tool 40 is formed of tungsten carbide. However, those skilled in the art will recognize that many other materials, including other metals, ceramics, plastics, etc., could be used to form the bonding tool 40. The bonding tool 40 of the preferred embodiment is a modified version of a model 30 ABT Style Slimline Back Autobonding Tool ® offered by Small Precision Tools, Petaluma, California.

Preferred Transducer

Because the ultrasonic transducer must supply a higher level of energy in cold and/or deep access bonding than is normally associated with ultrasonic bonding, the preferred ultrasonic transducer 20 has a modified bonding tool passage 24 to hold the bonding tool 40 in the ultrasonic transducer 20. The preferred bonding tool passage includes a V-groove design which provides increased excursion control of the bonding tool, allowing the tool 40 to wipe a lead 16 in a substantially linear manner across a bonding pad 14. In addition the modified design offers a bonding tool/transducer interface with increased wearability.

Standard bonding tools have a bonding tool passage with a circular cross-section. The circular passage offers only limited excursion control because the tool 40 is as free to move in one direction as any other. Such bonding tool passages also quickly wear into elliptically shaped holes when used with the higher power levels associated with cold and/or deep access bonding. That transducer wear contributes to the lack of excursion control found in standard passages which results in deterioration in bond strength and reliability.

Figure 2:
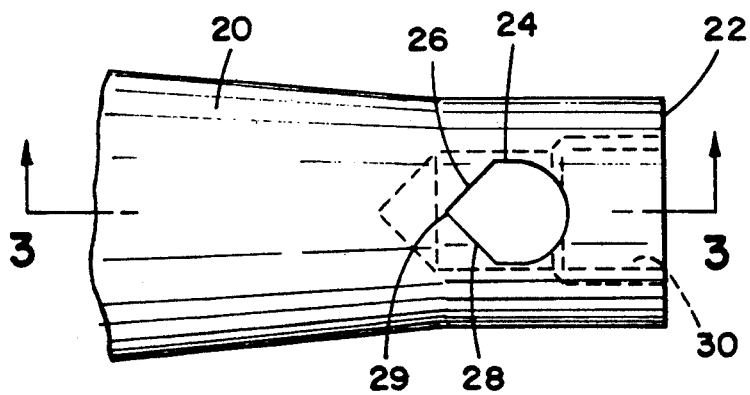
FIG. 2 is an enlarged top view of the end of the preferred transducer device.
Figure 3:
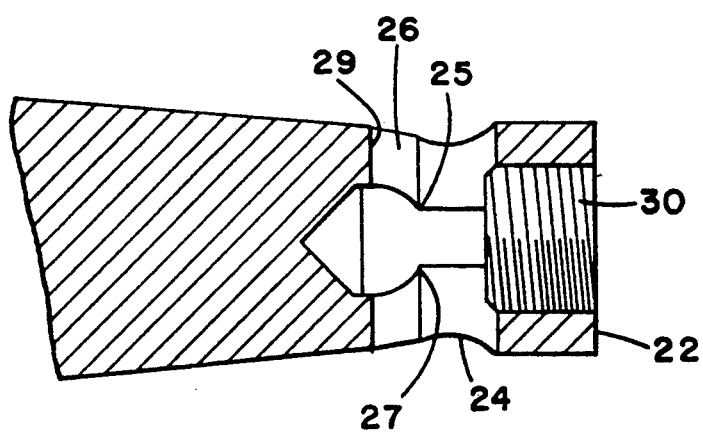
FIG. 3 is a gross-section of the preferred transducer device along line 3—3 in FIG. 2.

The preferred bonding tool passage 24, as shown in FIGS. 2 and 3, includes a V-groove formed by the two flat surfaces 26, 28 which are located opposite the end 22 of the transducer 20. The bonding tool 40 fits into the bonding tool passage 24 and extends the required distance to perform the bonding of a lead 16 to a bonding surface 14, as depicted in FIG. 1.

The bonding tool 40 is held in the preferred ultrasonic transducer 20 by the use of a set screw (not shown) which cooperates with the threaded hole 30 as shown in FIGS. 2 and 3. After insertion into the transducer 20, the bonding tool 40 is pressed against the flat surfaces 26, 28 by a screw inserted into threaded hole 30. The screw forces the bonding tool 40 against the flat surfaces 26, 28 and, more particularly, against points 25 and 27 located on flat side 26. It will be understood that a corresponding pair of points will be located on flat side 28, but are not shown in FIG. 3 because it is a cross-sectional view. The four-point contact could also be maintained by extending hole 30 in any diameter which may possibly be different than the diameter of hole 30 through the end 22 of the transducer 20.

It is the flat surfaces 26 and 28 of the passage 24, along with the four-point contact provided by extending hole 30 which provide the advantages of the preferred embodiment of the present invention. The flat surfaces 26 and 28 direct the tool excursions along a substantially straight line to allow the tool 40 to wipe the lead 16 across the pad 14 in a substantially linear manner. The four-point contact between the transducer 20 and bonding tool 40 offers an interface which decreases wear of the passage 24 as well as contributing to the excursion control of the bonding tool 40.

By using the above design, the transducer 20 is able to transmit higher-powered ultrasonic energy to the bonding tool 40 without excessive wear of the transducer/bonding tool interface. This is important because, in the preferred methods of using the present invention, ultrasonic transducers having ratings of up to 20 watts of energy are used, which would result in a loss of excursion control and excessive wear of the transducer/bonding tool interface if standard tools and transducers were used.

In the preferred embodiment, the flat surfaces 26, 28 are disposed at a right angle to each other and intersect along the line 29 as shown in FIGS. 2 and 3. It will be appreciated by those skilled in the art that the precise angle of intersection between surfaces 26 and 28 can vary, providing that the surfaces provide the fourpoint contact between the transducer 20 and bonding tool 40 to provide the extended life and increased excursion control of the present invention.

Figure 9:
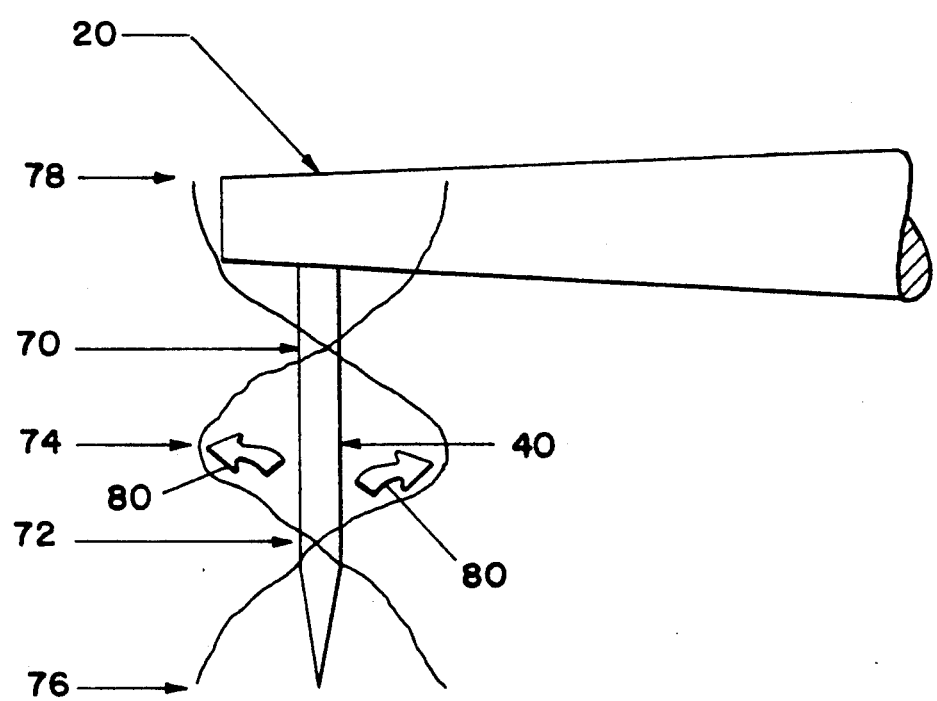
FIG. 9 is a side view of the preferred transducer and tool depicting the excursion of the tool during bonding.

The combination of the preferred tool 40 and preferred transducer 20 produces the wiping action as described above. The preferred tool 40 length of 0.75 inches was determined by measuring the excursion oil a prototype gold-plated tool along its entire length using a laser interferometer. A graphic representation of the results of that test is shown in FIG. 9. As seen there, the tool 40 produced two zero nodes 70, 72 along its length and three anti-nodes 74, 76, 78. The anti-nodes present the greatest excursion and, therefore, provide the optimal bond tool length.

Preferred Methods

As described briefly above, the preferred methods of the present invention include cold bonding of gold plated leads and bonding pads, as well as deep access bonding of the same. Both processes benefit from the features of the preferred embodiments of the transducer 20 and bonding tool 40 of the present invention. In view of the preferred embodiments described above, the preferred methods are described in more detail below.

In the preferred methods, the substrate 10 is preferably comprised of two layers of materials 11,12 forming a dual-density epoxy resin. The resin located directly beneath the bonding pads is preferably a BT-C Stage resin and the lower layer of resin is preferably an FR-4 epoxy. The more rigid epoxy resin (BT) 11 is located directly below the bonding pads 14 and the softer, less rigid epoxy resin (FR-4) 12 is located below the first layer of epoxy resin to absorb and disperse the ultrasonic energy applied to the bonding pad. This dual-density construction is important to supply a firm base for the high power levels used which is stable enough to provide reliable bonding while protecting any components below the bonding pad 14 from the ultrasonic bonding process. Other base materials could be substituted provided their physical characteristics provided the firmness and energy dissipation produced by the combination of materials described with respect to the preferred embodiment.

In the preferred methods of cold and/or deep access bonding, the lead 16 preferably comprises 1 oz. copper, which is approximately 1.4 mils thick. The copper of the lead 16 is gold-plated to enhance bonding as well as provide a lead that resists oxidation. The bonding pad 14 of the preferred method comprises a ⅜ oz. copper foil which is approximately 0.5 mils thick. The copper foil is overplated with additional copper to a height of approximately 2.5 mils and then nickel-plated, which is followed by a gold plating. The nickel layer is provided as a barrier to prevent migration of the gold plating into the copper. In the preferred method, the bonding pad gold plating is approximately 100-150 microinches thick. Such bonding pad and lead constructions are well known to those skilled in the art and will not be described further herein.

In the preferred methods, the transducer 20 is supplied with power by a 20 watt ultrasonic generator operating at a frequency of 60 khz and a constant voltage mode at approximately 175-225 microinches of excursion along the longitudinal axis of the transducer. Thermal augmentation of the bonding tool does not significantly affect the power requirements during bonding, but does assist with "softening" the lead for enhanced coupling to the bonding tool tip. The above transducer specifications satisfy the increased power requirements during deep access bonding over the power required during standard bonding utilizing bonding tools of the shorter standard lengths.

In its preferred method, the present invention produces reliable bonds between gold-plated leads and bonding pads located on an unheated circuit board or other substrate. The invention is capable of producing these bonds with or without thermal augmentation of the ultrasonic bonding tool 40 or the circuit board 10 and bonding pad 14. This method requires a higher amount of energy than that required for standard processes incorporating thermal augmentation; however, the unidirectional wiping action associated with the modified transducer/tool interface coupled with the gripping action of the raised pattern of the bonding tool allows bonding to occur without any thermal augmentation. This method may also require additional cleaning steps using deionized water and mild solutions of hydrochloric acid, dry plasma or an ultraviolet ozone process to clean the bonding pads 14 of any foreign material prior to bonding.

An alternate preferred method includes the use of an external heat source to heat the bonding tool 40, as depicted by the external heater 41 in FIG. 1. Referring to both FIGS. 1 and 8, this method of bonding includes heating the bonding tool 40 by a heater 41 attached to the bonding tool. The heater 41 used to add heat to the bonding tool 40 is preferably of an electrical resistance type and is well known to those skilled in the art. The heat can also be supplied by a heated gas jet, laser or any other suitable means known to those skilled in the art. In the preferred method, the heater raises the temperature of the bonding tool to approximately 150-200° C. It is the addition of that heat that allows the raised pattern 42 of the preferred bonding tool 40 to more quickly and efficiently form an impression 44 in the lead 16. That, in turn, speeds the bonding process by allowing the earlier transmission of ultrasonic energy to the lead 16 without the accompanying chance of having the lead 16 escape from underneath the bonding tool 40.

In either the unheated or heated preferred methods, it is the "gripping" of the lead 16 by the raised pattern 42 on the bonding tool 40 which allows the higher power levels required in cold and/or deep access bonding, particularly where the substrate 10 holding the bonding pad 14 cannot be heated. The gripping occurs because of the cooperation between the impression 44 and raised pattern 42, allowing the tool to grip the lead 16 during the application of ultrasonic energy and "wipe" (or move) it across the bonding pad 14 to bond the two together. Without the gripping action, the lead 16 would not remain under the bonding tool 40 during the ultrasonic bonding process which would result in a sub-standard bond.

The orientation of the preferred X-shaped raised pattern 42 of the preferred method is offset at a 45° angle from the direction of wiping, as shown in FIG. 4. The preferred wiping direction is shown by the arrows in FIG. 8, where it can be seen that the impression 44 created by the raised pattern 42 is offset approximately 45° from the wiping action, with the result being that the raised pattern 42 and corresponding impression 44 is substantially bisected by the direction of wiping.

Although the preferred embodiment of the bonding tool 40 has a substantially X-shaped pattern 42 as depicted in FIGS. 4 and 5, the primary purpose of the raised pattern is to provide a multidirectional gripping action between the bonding tool 40 and lead 16. As such, any pattern allowing the bonding tool to grip the lead and move it without slipping will suffice. Such patterns could include any number of raised patterns in addition to those depicted in FIGS. 4-7.

The modified V-groove transducer/tool interface, as described for the preferred embodiment above, is also used in the preferred methods of cold and/or deep access bonding to contribute to the "wiping" of the lead 16 across the bonding surface 14 by controlling the excursions of the tool 40. The excursions and resulting wiping action are preferably substantially linear and primarily in line with the longitudinal axis of the transducer 20. The substantially unidirectional wiping of the lead aids the bonding process by concentrating the ultrasonic energy used to bond the lead 16 to the bonding surface 14, rather than wiping the lead 16 randomly around the bonding surface 14.

The modified V-groove transducer/tool interface is also required in the preferred methods because of the high power necessary to bond using the preferred methods. The high power, if used with a standard circular bonding tool passage would result in a transducer/tool interface with a short useful life, as well as a lack of excursion control over the bonding tool tip. The V-groove design, however, offers a four-point contact between the tool 40 and transducer 20 which extends the useful life of the interface in spite of the higher power and/or longer bonding tool used in the preferred methods.

The elongated bonding tool 40 of the preferred embodiment and methods also allows the deep access bonding of leads 16 to bonding pads 14. In deep access bonding, the tool 40 and transducer 20 can be used to bond leads 16 to bonding pads located between structures 2,4 as depicted in FIG. 1. The preferred method includes the use of a bonding tool 40 with an overall length of 0.75 inches which allows ultrasonic bonding between structures having heights of up to 0.420 inches above the bonding surface 14. That amount of clearance cannot be provided by standard length bonding tools, which are only 0.375 to 0.437 inches long.

The control offered by the present invention results in stronger, more uniform bonding between leads and bonds. In destructive pull testing, the average force required to part bonds produced using the modified transducer and bonding tool of the present invention was 165 grams while the average force required to part bonds produced using standard transducers and bonding tools was only 115 grams. In addition, the standard deviation of the pull testing values for the modified transducer and bonding tool of the present invention was 16.5 grams, while the standard deviation for the standard transducers and bonding tools was 43 grams. Those test results demonstrate that the present invention produces more reliable bonds at higher strength than those produced by tools and methods used previously, thus allowing reliable high volume gold to gold bonding.

Although a transducer/tool interface and bonding tool and method of bonding have been described which are primarily directed at the bonding of a chip lead to the bonding pad of a circuit board, it should be understood that the apparatus and method are also capable of other bonding functions, including interlead bonding of integrated circuits as well as flexbonding applications, among others, and the invention should be limited in scope only by the claims attached hereto.

Although specific embodiments have also been illustrated and described herein, it will be appreciated by those of ordinary skill in the art that any arrangement which is calculated to achieve the same purpose may be substituted for the specific embodiments shown. Thus, it is manifestly intended that this invention be limited only by the claims and the equivalents thereof.

We claim:

1. An ultrasonic transducer device adapted to hold an ultrasonic bonding tool having a substantially circular cross-section, the device comprising:
    a first end adapted to cooperate with the bonding tool;
    a bonding tool passage formed in the transducer proximate said first end,s aid bonding tool passage adapted to receive the bonding tool in an orthogonal relationship relative to a longitudinal axis of siad device, said bonding tool passage having at least two substnatially flat surfaces which intersect each other opposite said first end; and
    at least one retaining passage formed in said first end, each retaining passage intersecting aid bondign tool passage and extending through said flat surfaces forming a four-point contact area in said flat surfaces, each retaining passage further adapted to receive retaining means for retaining the bonding tool within said bonding tool passage.

2. The device of claim 1, wherein said bonding tool passage further comprises a cross-section having a substantially semi-circular portion opposite the intersection of said flat surfaces.

3. The device of claim 1, further comprising one retaining passage having a circular cross section formed substantially coaxially with a longitudinal axis of said device.

4. The device of claim 1, wherein the itnersection of the flat surfaces of said bonding tool passage is substantially perpendicular.

5. The device of claim 1, wherein said retaining passage comprises a threaded hole formed substantially coaxial with a longitudinal axis of said device and further wherein said retaining means comprises a threaded member adapted to cooperate with said retaining passage to contain a bonding tool in said bonding tool passage.

* * * * *